(12) United States Patent
Harju et al.

(10) Patent No.: US 6,433,650 B1
(45) Date of Patent: Aug. 13, 2002

(54) ELECTRICAL TRANSMISSION ARRANGEMENT

(76) Inventors: Thomas Harju, Stora Skogsvägen 31, Sävedalen (SE), S-433 70; Björn Albinsson, Anders Mattssonsgatan 38, Göteborg (SE), S-425 06

( * ) Notice: Subject to any disclaimer, the term of this patent is extended or adjusted under 35 U.S.C. 154(b) by 66 days.

(21) Appl. No.: 09/597,988

(22) Filed: Jun. 19, 2000

(30) Foreign Application Priority Data

Jun. 17, 1999 (SE) .............................................. 9902295

(51) Int. Cl.$^7$ ................................................. H01P 3/08
(52) U.S. Cl. .......................... 333/33; 333/238; 174/264
(58) Field of Search ........................ 333/33, 238, 246; 174/264

(56) References Cited

U.S. PATENT DOCUMENTS

| | | | | |
|---|---|---|---|---|
| 5,408,053 A | * | 4/1995 | Young | 333/238 X |
| 5,757,252 A | * | 5/1998 | Cho et al. | 333/246 |
| 6,163,233 A | * | 12/2000 | Adkins | 333/238 X |

FOREIGN PATENT DOCUMENTS

| | | |
|---|---|---|
| EP | 0 525 810 A1 | 2/1993 |
| EP | 0 848 447 A2 | 6/1998 |
| GB | 2272112 A | 5/1994 |
| JP | 9083232 A | 3/1997 |

* cited by examiner

Primary Examiner—Benny T. Lee

(57) ABSTRACT

The invention relates to an electrical transmission arrangement comprising a first section of a conductor with a main extension in a first and a second plane, and a first section of a ground plane which extends essentially in parallel with the first conductor section on a first side thereof, at a certain first distance therefrom and has a main extension in the same two planes as the first conductor section, which first conductor section and first ground plane section together are included in a microstrip arrangement, and a second section of the same conductor, a second and a third ground plane section, where the second and third ground plane sections extend essentially in parallel with the second conductor section on a first and, respectively, second side thereof at a second and, respectively, third distance therefrom, where the second conductor section and the second and third ground plane sections are included in a strip-line arrangement, in which transmission arrangement the conductor sections are separated from adjacent ground plane sections by a dielectric medium. The first and the second conductor sections are displaced in parallel with respect to one another along a third plane and exhibit an electrical connection to one another, and the ground plane sections are displaced in parallel with respect to one another along the same plane as the displacements of the conductor sections.

13 Claims, 4 Drawing Sheets

ELECTRICAL TRANSMISSION ARRANGEMENT

TECHNICAL FIELD

The present invention relates to an electrical transmission arrangement for use preferably within the microwave field, in applications where both strip-line technology and microstrip technology are used and where it is desirable be able to transfer high-frequency signals between conductors constructed in these two technologies. The invention is primarily intended to be applied where there is a need for transferring electrical signals between different layers of dielectric substrate in a circuit card.

BACKGROUND

In the transmission of electrical signals in the microwave field, especially in circuit cards, it is usual to make use of the microstrip technology or strip-line technology. In microstrip technology, a usually flat conductor is used, separated from an associated ground plane of a dielectric substrate, where the dielectric substrate is frequently the carrier of a circuit card. The ground plane is also usually flat and mainly arranged in parallel with the conductor at an essentially constant distance from this. The strip-line technology comprises the same components as the microstrip technology, but with a second ground plane arranged on the opposite side of the conductor with respect to the first ground plane. The second ground plane should also be arranged mainly in parallel with the conductor, separated from the conductor by the dielectric substrate, at an essentially constant distance from the latter, preferably at the same distance as the first ground plane.

In certain cases, it may be desirable to have transitions between microstrip conductors and strip-line conductors. Since both strip-line and microstrip are technologies which are used in high-frequency bands, it is a requirement that the transition between conductors constructed in these technologies should have as high as possible a cut-off frequency and the lowest possible losses.

Furthermore, it is a requirement that it should be possible to implement a transition between strip-line and microstrip on a circuit card constructed in so-called multilayer technology. As is indicated by the name, multilayer technology means that conductors and other components are arranged in different layers in a dielectric substrate which constituents the carrier for a circuit card. It may then be desirable to transfer signals from components or conductors on one of the layers of the circuit card to conductors or components on another layer of the circuit card.

Since microstrip technology, according to the above description, has one conductor with a ground plane on one side and strip-line technology has one conductor with ground planes on both sides, it should be possible to construct a transition between microstrip and strip-line quite simply by providing the microstrip conductor with a further ground plane at a certain point, which creates a strip-line arrangement. Conversely, it should be possible to remove one of the ground planes in a strip-line arrangement at a certain point, which creates a microstrip arrangement. However, such a transition would have relatively high losses and a low cut-off frequency.

SUMMARY OF THE INVENTION

The problem which is solved by the present invention is thus that of being able to transfer electrical signals between conductors and components in different layers in a multilayer circuit card in a transition between microstrip technology and strip-line technology with low power losses, a high cut-off frequency and at distances which are largely optional.

This problem is solved with the aid of an electrical transmission arrangement which comprises a first section of a conductor with a main extension in a first and a second plane, and a first section of a ground plane, which extends essentially in parallel with the first conductor section on a first side thereof, at a certain first distance therefrom and has a main extension in the same two planes as the first conductor section. The first conductor section and first ground plane section are together included in a microstrip arrangement. The arrangement also comprises a second section of the same conductor, a second and a third ground plane section, where the second and third ground plane sections extend essentially in parallel with the second conductor section on the first and, respectively, second side thereof at a second and, respectively, third distance therefrom. The second conductor section and the second and third ground plane sections are thus included in a strip-line arrangement.

In the transmission the conductor sections arrangement are separated from adjacent ground plane sections by a dielectric medium.

The first and the second conductor sections are displaced in parallel with respect to one another along a third plane and exhibit an electrical connection to one another, and the ground plane sections are displaced in parallel with respect to one another along the same plane as the displacements of the conductor sections. These parallel displacements of the conductor sections and ground plane sections along a third plane which does not coincide with the two planes in which the conductor sections and ground plane sections have their main extensions have the result that the ground planes can be made to "accompany" their respective conductor sections in a stepped construction which can comprise a transition between microstrip and stripline, and can extend through basically any number of layers in a multilayer construction. Since the ground planes "accompany" their respective conductor sections, the distance between ground plane section and conductor section can be kept essentially constant which contributes to the arrangement having a high cut-off frequency and low losses.

The conductor sections are furthermore suitably displaced with respect to one another in a direction which coincides with one of the two planes which define the main extensions of the conductor sections. This contributes to it being possible for the arrangement to be run along this plane.

To further increase the number of "steps" in the stepped construction which has been mentioned above, the transmission arrangement according to the invention can also comprise a third conductor section which cooperates with a fourth and a fifth ground plane section situated on both sides of this third conductor section, at a fourth and, respectively, fifth distance therefrom, for forming a continuation of the said strip-line arrangement. The third conductor section and the fourth and fifth ground plane sections suitably have their main extensions in the same two planes as the other conductor sections and ground plane sections which are included in the strip-line arrangement, whereby the third conductor section is displaced in parallel with respect to the other conductor sections along a third plane, and the third conductor section exhibits an electrical connection to the closest of the other conductor sections. The fourth and fifth ground plane sections should be displaced with respect to the other ground plane sections along the same plane as the displacements of the conductor sections.

To further improve the electrical characteristics of the arrangement, at least one of the ground plane sections is preferably electrically connected to one of the closest ground plane sections on the same side of a conductor section.

The third conductor section should also be displaced with respect to the other conductor sections in a direction which coincides with one of the two planes which define the main extensions of the conductor sections, which also applies to the ground plane sections which cooperate with this conductor section.

To achieve the advantageous stepped construction, the conductor sections which are included in a transmission arrangement according to the invention should exhibit this progressive displacement with respect to one another in a direction which coincides with one of the two planes which define the main extensions of the conductor sections. Furthermore, it is advantageous if two adjacent conductor sections exhibit different lengths in the direction in which they are progressively displaced with respect to one another.

The ground plane sections which are included in a transmission arrangement according to the invention should also exhibit this progressive displacement with respect to one another in a direction which coincides with one of the two planes which define the main extensions of the ground plane sections. For practical reasons, two adjacent ground planes on the same side of a conductor sections can also exhibit different lengths in the direction in which they are progressively displaced with respect to one another.

The connection between two adjacent conductor sections is suitably situated in connection with the edges of the two conductor sections which are closest to one another.

In a certain preferred embodiment of the invention, the conductor sections are progressively displaced with respect to one another in a direction which coincides with one of the two planes which define the main extensions of the conductor sections, and the ground plane sections are progressively displaced with respect to one another in a direction which coincides with one of the two planes which define the main extensions of the ground plane sections.

To facilitate the construction of a transmission arrangement according to the invention, two adjacent ground plane sections can be given different lengths in the direction in which they are progressively displaced with respect to one another, whereby the displacement of the ground plane sections arises by one part of a ground plane section extending passed an edge of an adjacent ground plane section.

To minimize the power losses in a transmission arrangement according to the invention, the ground plane sections and conductor sections should be constructed in such a manner that all points on all conductor sections exhibit essentially the same capacitance with respect to the ground plane. This is suitably achieved by the connection between two adjacent conductor sections passing an edge in a ground plane section, which edge is constructed for impedance matching. In a preferred embodiment of the invention, this construction provides at least a part of the edge with an elliptical shape.

BRIEF DESCRIPTION OF THE FIGURES

The invention will be described in greater detail below with the aid of examples of embodiments and with reference to the attached drawings, in which.

DETAILED DESCRIPTION OF PREFERRED EMBODIMENTS

Figure 1:
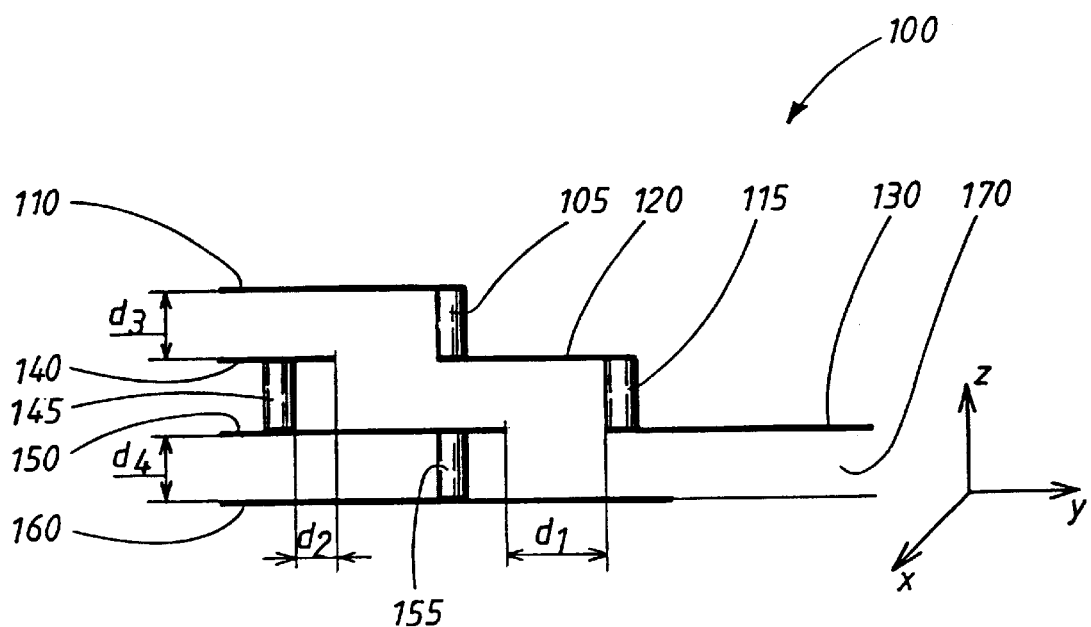
FIG. 1 shows a cross section from one side of a microstrip arrangement according to the invention.

FIG. 1 shows a cross section from the side of a transmission arrangement 100 according to the invention, mainly intended for microstrip applications. To facilitate the understanding of the description of the invention, a three-dimensional orthogonal Cartesian co-ordinate system (x,y,z) has been drawn in connection with FIG. 1.

As can be seen from FIG. 1, the arrangement 100 comprises a first conductor section 110, a second conductor section 120 and a third conductor section 130. All conductor sections are flat and, in other words, have their main extensions in two planes (x,y). As can also be seen from FIG. 1, the conductor sections are situated in different layers in a dielectric substrate 170 and are arranged in such a manner, that the first conductor section 110 is displaced in parallel with respect to a second conductor section 120 and a second conductor section 120 is displaced in parallel with respect to the third conductor section 130.

For the sake of clarity, it can be said that the progressive parallel displacements of the conductor sections occur in a direction (z) which is at right angles to the two planes (x,y) which define the main extensions of the conductor sections.

Apart from the fact that the conductor sections are displaced in parallel with respect to one another in the manner which has been described above, the conductor sections are suitably progressively displaced with respect to one another in another direction which coincides with one of the two planes (y) which define the main extensions of the conductor sections. In other words, the second conductor section is displaced in parallel with respect to the first conductor section and is also displaced in that direction (y), which also applies to the third conductor section displaced with respect to the second conductor section.

The invention can be extended with an arbitrary number of conductor sections and it should only be considered as an example that the number of conductor sections in the drawing is three. The principle, described above, of how the conductor sections are arranged with respect to one another should be applied throughout the arrangement regardless of the number of conductor sections.

The arrangement 100 also comprises first, second, and third ground plane sections 140, 150, and 160, respectively, which are separated from the conductor sections and from one another by the dielectric material 170. Like the conductor sections, the ground plane sections are also essentially flat and have their main extensions in the same two planes (x,y) as the conductor sections 110, 120, 130.

The first ground plane section 140 essentially extends in parallel with the first conductor section 110 on the first side of this conductor section at a certain distance (d3) from the first conductor section. The second ground plane section 150 is displaced in parallel with respect to the first ground plane section 140, and the third ground plane section 160 is likewise displaced in parallel with respect to the second ground plane section 140.

For the sake of clarity, it can be pointed out here, that the parallel displacement of the ground plane sections occurs in the same direction as the parallel displacement of the conductor sections, in other words, a direction (z) which is at right angles to the two planes (x,y) which define the main extensions of the conductor sections and the ground plane sections.

Like the conductor sections, the ground plane sections are suitably also progressively displaced with respect to one another in a direction (y) which coincides with one of the two planes (x,y) which define the main extensions of the ground plane sections. In other words, the second ground plane section is displaced in parallel (z) with respect to the first ground plane section and also displaced in the direction (y), which also applies to the third ground plane section with respect to the second ground plane section.

Displacement of the ground plane sections with respect to one another in a direction (y) which coincides with one of the two planes (x,y) which define the main extensions of the ground plane sections can be suitably done in a way which is shown in FIG. 1, which means that each ground plane section is made longer than one of the closest ground planes, which has a result that the displacement arises by a part of each ground plane extending past the edge of one of the closest ground planes. In other words, in practice, a stepped formation of ground plane sections is formed.

In a variant of the invention which is shown in FIG. 1, the ground plane sections are constructed in such a manner that they only have different lengths in the direction (y) in which they will be progressively displaced with respect to one another.

The invention can be extended with an arbitrary number of ground plane sections and it should only be considered as an example that the number of ground plane sections in FIG. 1 is three. The principle, described above, of how the ground plane sections are arranged with respect to one another should, however, be applied for the arrangement regardless of the number of ground plane sections. However, the arrangement suitably has the same number of ground plane sections as the number of conductor sections in the embodiment which is intended for microstrip applications.

The first ground plane section 140 extends essentially parallel with the first conductor section 110, and since the ground plane sections and conductor sections are mutually displaced in parallel and also progressively displaced in another direction (y), the result is that the second ground plane section 150 will be essentially in parallel with the second conductor section 120, a relationship which also applies to the third ground plane section 160 with respect to the third conductor section 130.

The distance between the second conductor section 120 and the second ground plane section 150 is suitably the same as the distance (d3) between the first conductor section 110 and the first ground plane section 140, which also applies to the distance between the third conductor section 130 and the third ground plane section 160. The principle of equal distances between a conductor section and its closest ground plane section is suitably observed regardless of how many conductor sections and corresponding ground plane sections are included in the arrangement. For the sake of clarity, it can be pointed out here, that the closest ground plane section means the one which is closest in the direction which at right angles to the two planes (x,y) which define the main extensions of the conductor sections and the ground plane sections.

The distance $d_4$ between the second and the third ground plane section is suitably also the same between two adjacent ground plane sections in the whole arrangement.

Every one of the conductor sections 110, 120, 130 is electrically connected to the closest of the second conductor sections and every one of the ground plane sections 110, 120, 130 is electrically connected to the closest of the second ground plane sections. The connections 105, 115 between the conductor sections and the connections 145, 155 between the ground plane sections are suitably constructed of so-called through-holes, in other words holes which are made in the dielectric material 170 which separates the conductor sections and, respectively, ground plane sections from one another, after which the holes are metallized completely or partially which makes the through-holes electrically conducting. The more detailed construction and placing of the connections between the ground planes and between the conductor sections will be described in detail below in connection with FIGS. 2, 3 and 5.

Figure 2:
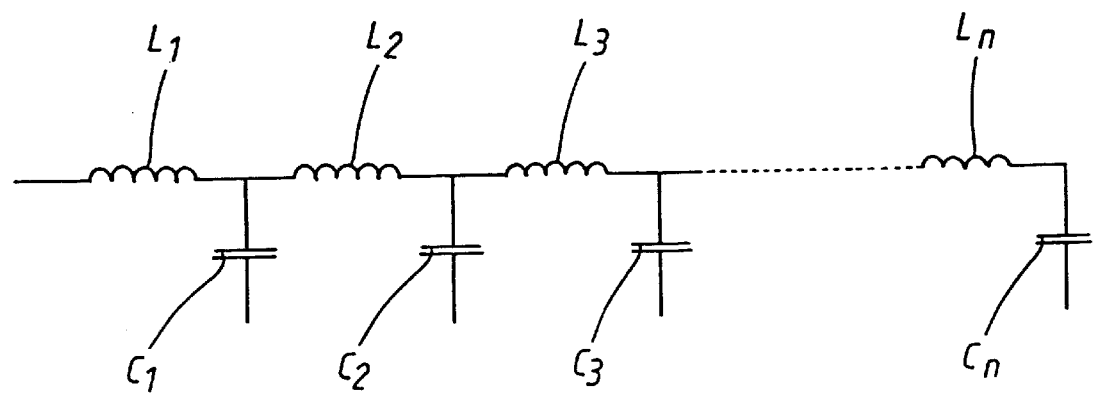
FIG. 2 shows an equivalent circuit diagram for an arrangement according to the invention.

FIG. 2 shows an equivalent circuit diagram for a microstrip arrangement or strip-line arrangement. As can be seen from FIG. 2, the equivalent circuit diagram is made up of a number of inductances $L_1, L_2, L_3, \ldots L_n$ and a corresponding number of capacitances, $C_1, C_2, C_3, \ldots C_n$. The magnitude of the inductances and capacitances in a conventional microstrip arrangement or strip-line arrangement depends to a large extent on the distance/distances between the conductors and the ground planes of the arrangement, and on the width of the conductors and the ground planes. A conventional microstrip arrangement or strip-line arrangement is thus constructed to provide a certain required impedance.

It is desirable, that an arrangement according to the invention provides the lowest possible power losses, with the result, that the arrangement should be constructed in such a manner that it exhibits the same impedance as the surrounding microstrip arrangement or strip-line arrangement in which it will be used. To obtain this result, the ground plane sections and conductor sections in the arrangement should be constructed in such a manner that all points on all conductor sections exhibit essentially the same capacitance with respect to the ground plane. This impedance matching of the arrangement according to the invention is produced not only by influencing the width of the conductors and the ground planes and the distance between the conductors and the ground planes, but also by the construction of the connections 145, 155 between the different ground plane sections and of the connections between the different conductor sections 105, 115 which will be described below.

Figure 3:
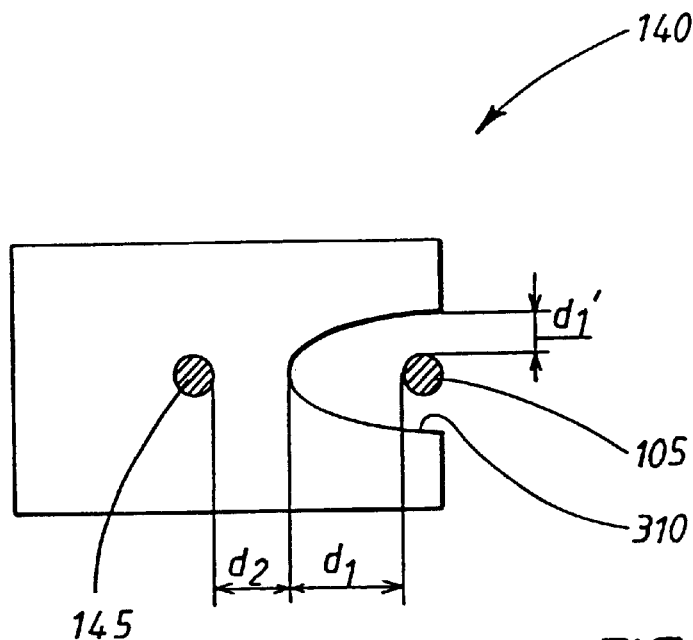
FIG. 3 shows a ground plane according to the invention, as seen from above.

FIG. 3 shows an example of how a ground plane section for use in an arrangement according to the invention can be constructed, for example the ground plane section 140. However, the principles which will be described for the construction of the ground plane section 140 also apply to all ground plane sections in an arrangement according to the invention intended for microstrip applications.

The ground plane section 140 is shown "from above" in FIG. 3, in other words, from the direction (z) in which the different conductor sections and ground plane sections are displaced in parallel with respect to one another. The drawing also shows the connection 145 between the ground plane 140 and "next" ground plane 150, and the connection 105 between the first conductor section 110 and the second conductor section 120. The principles which will be described here for how the connections between two conductor sections are placed with respect to a ground plane section are also generally applicable for an arrangement according to the invention intended for microstrip applications.

As can be seen from FIG. 1 and FIG. 3, the connection 105 between the two conductor sections 110 and 120 passes an edge 310 in the first ground plane section 140. Since the impedance of the arrangement 100 is affected by the distance between the conductor sections and the ground planes, the edge 310 of the ground plane section and the distance between the edge 310 and the connection 105 between two conductor sections should be constructed in such a manner, that the total capacitance between the edge 310 and the connection 105 is spread as uniformly as possible. An advantageous way of achieving this is to construct a part of the edge 310 as a part of an imagined ellipse, the connection 105 being placed essentially in the centre point of the imagined ellipse. Also shown in FIGS. 1 and 3 is the distance $d_1$ between the end of the ground plane 150 and the conductor section connection 115.

FIG. 3 also shows the connection 145 which connects the first ground plane 140 with the second ground plane section 150. To achieve the required impedance matching in an arrangement according to the invention, the distance d2 between the connection, through-hole 145, and the edge 310 on the ground plane section which the connection between two conductor sections passes should be of such magnitude, that the capacitance coupling between the conductor connection 105 and the edges of the parts of the ground plane section 140 which are closest to the connection 145, which parts are made up of the edges of the ellipse in the present case, dominates over the capacitance coupling which is produced between the ground plane connection 145 and the conductor connection 105. FIG. 3 also shows a distance $d_1'$ between the conductor connection 105 and a closest side of the edge 310 in the (x) direction.

Figure 4:
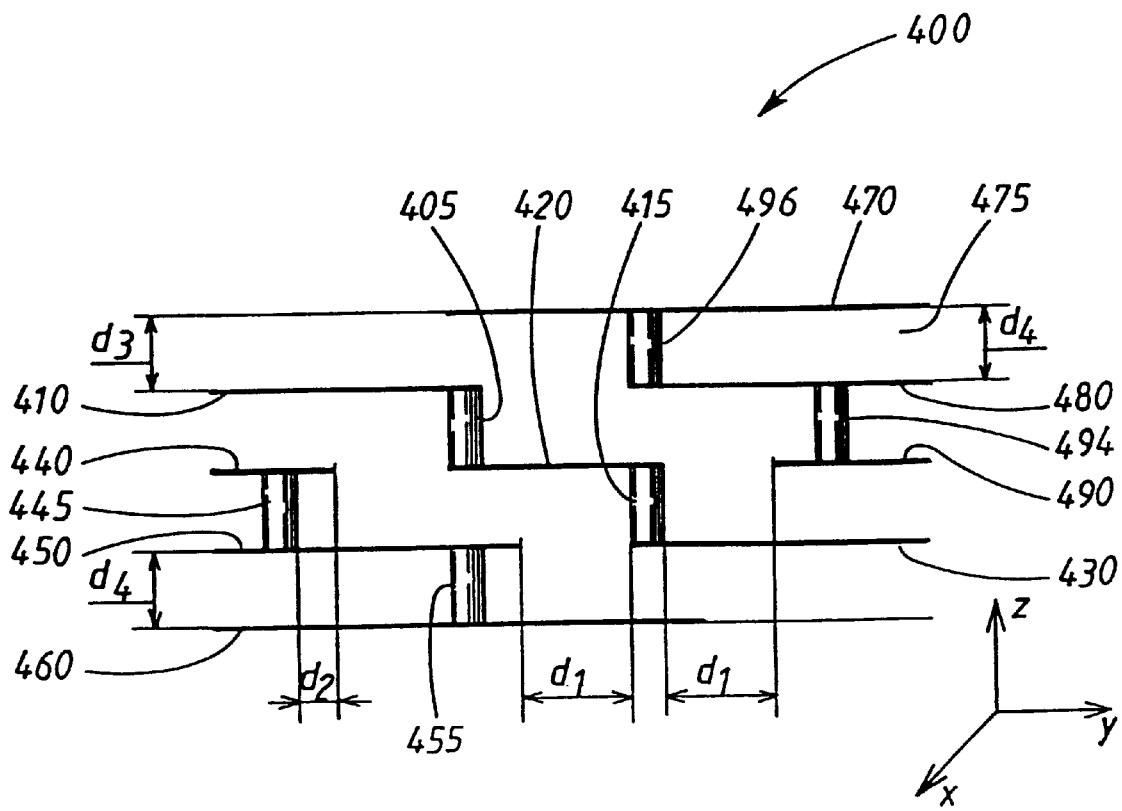
FIG. 4 shows a cross section from one side of a strip-line arrangement according to the invention.

FIG. 4 shows a cross section from the side of an arrangement 400 according to the invention, intended for strip-line applications. The conductor sections in arrangement 400 in FIG. 4 correspond to the conductor sections in the variant 100 of the arrangement which is intended for microstrip applications, but since the strip-line technology comprises one conductor with two ground planes, one on each side of the conductor, the arrangement 400 according to the invention should comprise at least another ground plane section 470 situated on the other side of one of the conductor sections 410. The ground plane section 470 cooperates with the closest ground plane section 440 on the first side of the conductor section to form an arrangement according to the strip-line principle. The second ground plane section 470 is suitably situated at the same distance d3 from the second side of the conductor section 410 as the ground plane section 440 on the first side of the conductor section 410, with which it is cooperating. Sections 470 and 480 are connected by connector 496, sections 480 and 490 by connector 494, sections 440 and 450 by connector 445, sections 450 and 460 by connector 455, sections 410 and 420 by connector 405, and sections 420 and 430 by connector 415.

In a preferred embodiment, an arrangement according to the invention, which will be used in strip-line applications, comprises ground plane sections on one first and one second side of all conductor sections in the arrangement. For the arrangement shown in FIG. 4, this means that the arrangement 400 on the second side of the conductor section 410, 420, 430, apart from the abovementioned further ground plane sections 470, also comprises two further ground plane sections 480, 490, situated on this second side of the conductor section. These two further ground plane sections 480, 490 are also situated at the same distance $d_3$ from their respective conductor sections 420, 430 as the ground plane sections 450, 460 on the first side of the conductor sections with which the ground plane sections on the second side is cooperating. This principle of equal distances between cooperating ground plane sections on both sides of the conductor sections should be taken into consideration regardless of how many conductor sections and ground plane sections a strip-line arrangement according to the invention is provided with.

Every one of the ground plane sections 470, 480, 490 on the second side of the conductor sections in the variant of the invention which is intended for strip-line applications also corresponds to a ground plane section on the first side of the conductor section with regard to dimensioning, construction etc., in all essential respects. To facilitate the understanding of this principle, the following can be pointed out with reference to FIG. 4: The ground plane sections 470 and 440 together form a ground plane according to the strip-line principle for a part of the conductor section 410. However, it is the ground plane section 470 on the second side of the conductor sections with respect to construction and dimensioning which corresponds to the ground plane section 460 on the first side since these two ground plane sections are those which are located "outermost" in the arrangement. This principle with respect to correspondence between two ground plane sections on both sides of the conductor sections should apply to all ground plane sections in an arrangement intended for strip-line applications.

Certainly, the ground plane sections 470, 480, 490 on the second side of the conductor sections are also separated from their corresponding conductor sections by a dielectric material 475 and, like the ground plane sections on the first side, each ground plane section on the second side is connected to the closest one of the second ground plane sections.

With the principles, described above, for placing and dimensioning the ground plane sections, the following can finally be described with respect to an arrangement according to the invention which is intended to be applied in association with strip-lines: The ground plane sections 470, 480, 490 on the said second side of the conductor sections are, like the ground plane sections on the first side of the conductor sections, progressively displaced with respect to one another in a direction (y) which coincides with one of the two planes (x, y) which define the main extensions of the ground plane sections. This displacement is suitably carried out in the same way as the displacement in the same direction of the ground plane sections on the first side of the conductor sections; each ground plane section is made longer than one of the closest ground planes which has a result that the displacement is produced by a part of each ground plane extending past the edge on one of the closest ground planes. In other words, in practice, a stepped formation of ground plane sections is formed.

In the variant of the invention which is shown in FIG. 4, the ground plane sections are constructed in such a manner that they only have different lengths in the direction (y) in which they will be progressively displaced with respect to one another. With respect to this difference in length, the ground plane sections 470, 480, 490 on the second side of the conductor sections can also suitably be given the same lengths as a corresponding ground plane section 460, 450, 430 on the first side (see FIG. 4).

In the variant of the invention which is intended for strip-line applications, each conductor section is also connected with one or more of the other conductor sections, suitably the closest ones, in the same way as has been described above in connection with FIG. 1. As can be seen from FIG. 4, the connections between two adjacent conductor sections pass at least one edge in a ground plane section on the said second side of a conductor section, which is why this edges should be constructed for impedance matching of the transmission arrangement.

The construction of the ground plane sections which has been shown above in connection with a microstrip variant of the invention can be advantageously also applied to the variant of the invention which is intended to be used in association with strip-lines. The result is that the ground plane section which is shown in FIG. 3 and which has been described above can also be applied in association with strip-lines. The description of the ground plane section 300 in FIG. 3 will not, therefore, be repeated here.

As can be seen from FIG. 4, at least one ground plane section 440 on the first side of the conductor sections will end up at the same "level" in the dielectric substrate 475 as one of the ground plane sections 490 on the second side in the arrangement 400. The result is that the two ground planes 440, 490, which are located at the same level, instead of being constructed as two separate sections with the appearance of section 300 in FIG. 3, can be constructed as a coherent disc with a recess in the centre, through which recess the connection between two conductor sections goes.

Figure 5:
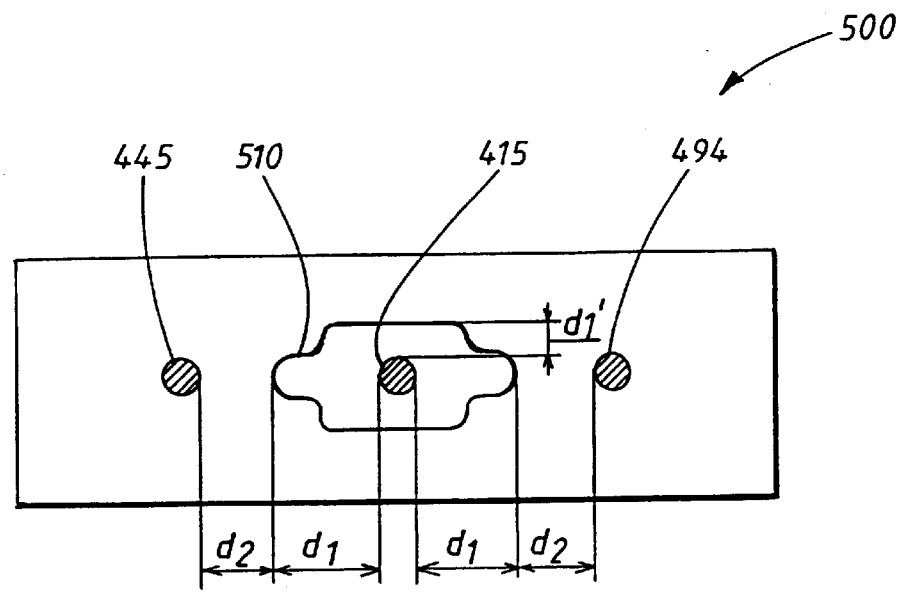
FIG. 5 shows an alternative ground plane according to the invention, as seen from above.

Such a coherent disc 500 for use as ground plane section in a arrangement 400 according to the invention which is intended to be used in strip-line applications is shown in FIG. 5. FIG. 5 shows the recess in the disc, the connection 415 between two conductor sections 420, 430 which go through the recess in the disc, and two connections 445, 494, which connect the disc with the two closest ground plane sections 450, 480.

As can be seen from FIG. 5, the elliptical shape of the edge 510 is retained on the recess which is closest to the connections 445, 495 to the other ground planes. The distance $d_2$ between the ground plane connections 445, 494 and the edge is preferably the same and is suitably selected according to the principles which have been described for corresponding connections in association with FIG. 3.

The connection 415 between two conductor sections is suitably placed in the centre of the recess in a disc 500 which, due to the shape of the recess, has the result that the connection 415 will have a largest distance ($d_1$) and a smallest distance ($d_1'$) to the edge 510 of the recess.

Figure 6:
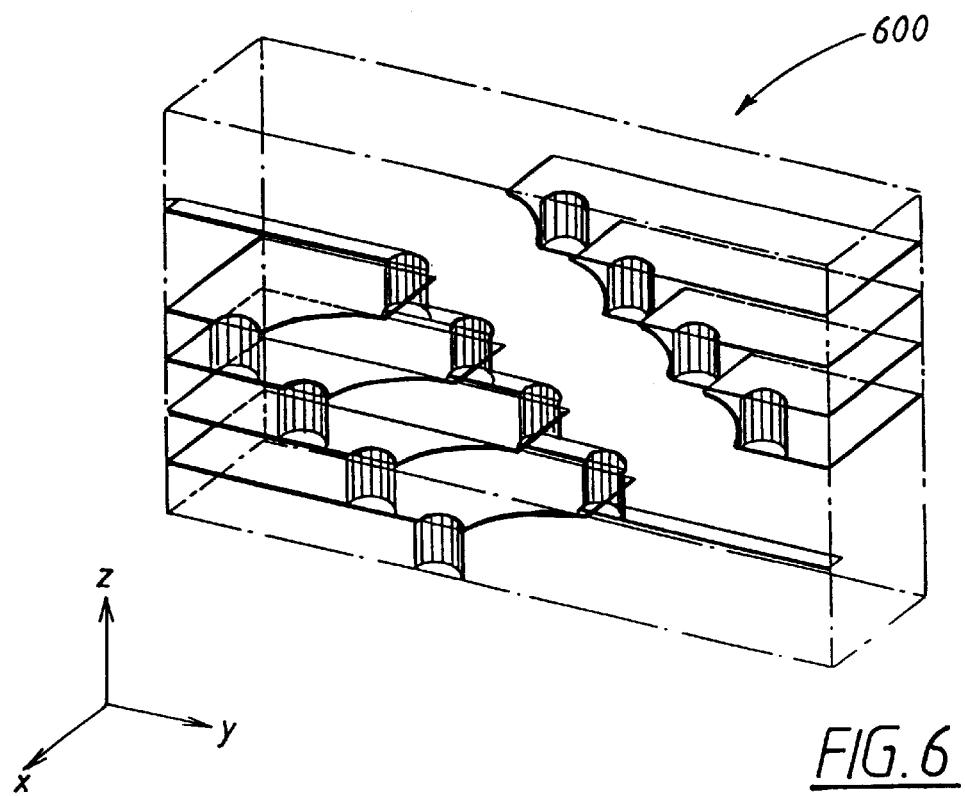
FIG. 6 shows a cross section in perspective of a strip-line arrangement according to the invention.

FIG. 6 shows a cross section in perspective of an arrangement 600 according to the invention, intended for strip-line applications. FIG. 6 shows the stepped construction which the ground plane section has on both sides of the conductor sections. FIG. 6 also shows the connections between different ground plane sections and the connections between different conductor sections.

Figure 7:
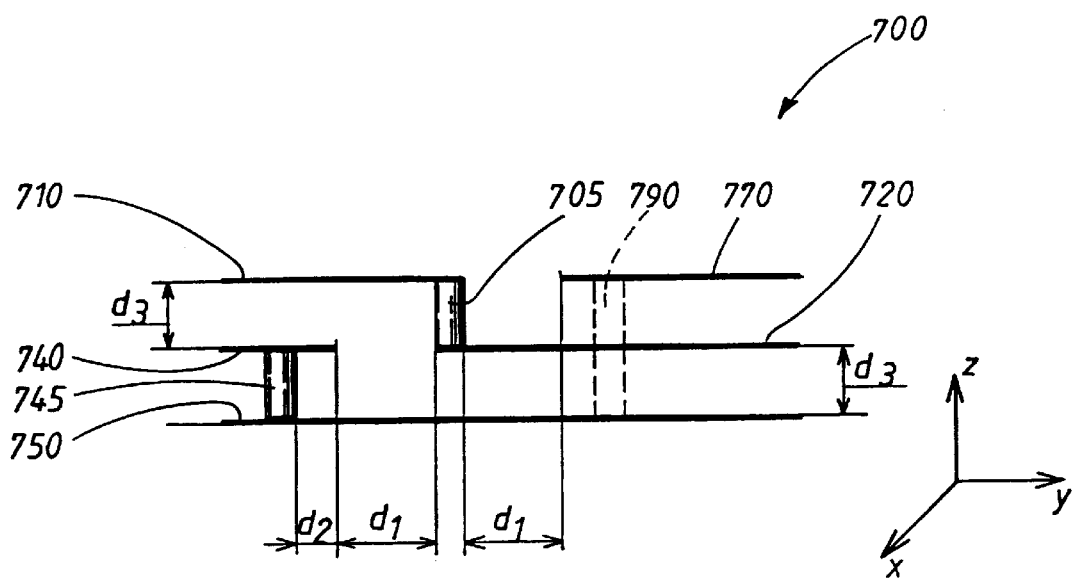
FIG. 7 shows a transmission arrangement according to the invention, seen from the side.

FIG. 7 shows a transmission arrangement 700 according to the invention seen from the side. In the variant of the invention which is shown in FIG. 7, the transmission arrangement comprises a transition between a microstrip arrangement and a strip-line arrangement, in a manner which will be explained in the text following. To facilitate the understanding of the three dimensional structure of the transmission arrangement 700, a three-dimensional co-ordinate system (x-y-z) has been drawn in FIG. 7.

The microstrip part of the transmission arrangement 700 comprises a first section 710 of a conductor which has a main extension in a first x and a second (y) plane, and a first section 740 of a ground plane which extends essentially in parallel with the first conductor section on a first side thereof, at a certain first distance ($d_3$) therefrom. The first ground plane section 740 has its main extension in the same two planes (x,y) as the first conductor section.

The strip-line part of the transmission arrangement 700 also comprises first, second, and third ground plane sections, 720, 750, and 770, respectively, which cooperate with the second conductor section 720. Ground plane sections 740 and 750 are connected by connection 745. The second 750 and the third 770 ground plane section extend essentially in parallel with the second conductor section 720 on a first and, respectively, second side thereof, at a second distance d3 and, respectively, third distance d3 therefrom. The conductor sections 710, 720 are separated from their adjacent ground plane sections by a dielectric medium.

To achieve the desired transition between microstrip part and strip-line part, the arrangement 700 exhibits an electrical connection 705 between the first and second conductor sections 710, 720. Like the embodiments of the invention which have been described above, the two conductor sections 710, 720 are displaced in parallel with respect to one another along a third plane (z). The ground plane sections 740, 750, 770 are displaced in parallel with respect to one another along the same plane (z) as the displacements of the conductor sections 710, 720.

The conductor sections 710, 720 are suitably also displaced with respect to one another in a direction (y) which coincides with one of the two planes (x,y) which define the main extensions of the conductor sections, which provides the conductor in the arrangement 700 with the stepped construction which has been described above in connection with other embodiments of the invention. It is also advantageous if at least one of the ground plane sections 740, 750, 770 is electrically connected to one of the closest ground plane sections on the same side of a conductor section.

The ground plane sections 740, 750, 770 are advantageously also progressively displaced with respect to one another in a direction (y) which coincides with one of the two planes (x,y) which define the main extensions of the ground plane sections.

The arrangement 700 can suitably also comprise an electrical connection 790 between the ground plane sections 750, 770 which cooperate with the second conductor section 720 in order to form a strip-line arrangement. This connection 790 is indicated by dashed lines in FIG. 7 and is preferably situated in connection with the edge on the third ground plane section 770 which is close to the connection 705 between the conductor sections. The connection 790 is not in contact with any part of the conductor sections or the connection between them.

Figure 8:
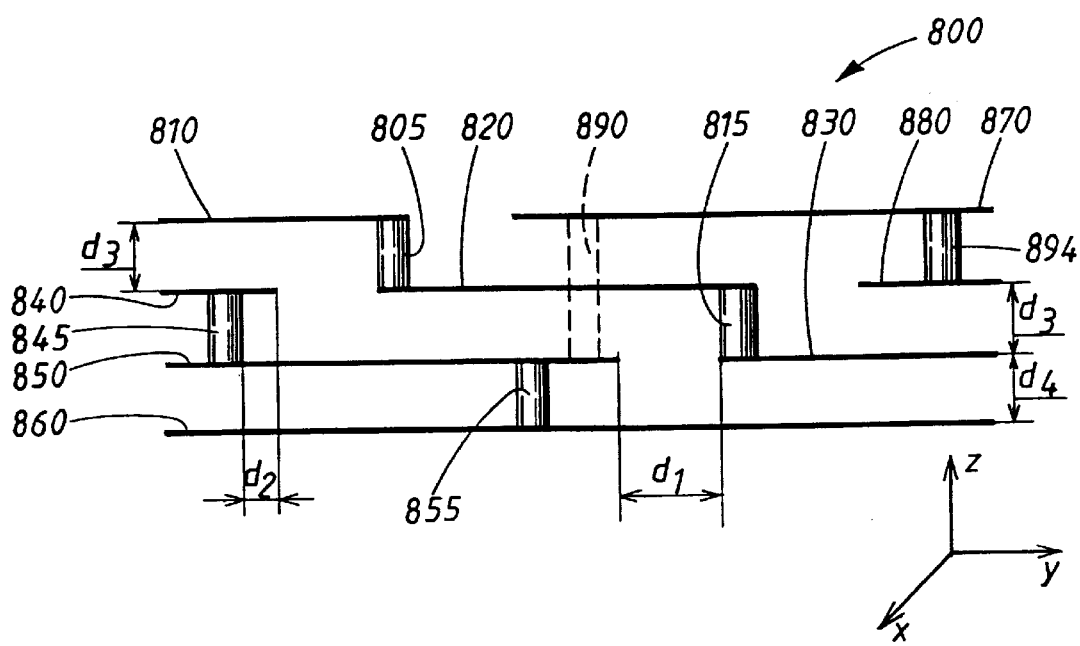
FIG. 8 shows a variant of a transmission arrangement according to the invention, seen from the side.

FIG. 8 shows a transmission arrangement 800 which comprises a transition between microstrip and strip-line constructed in accordance what has been described above in association with FIG. 7. The transmission arrangement 800 shows an example of how such a transition can be used for conducting signals from a microstrip part further in a strip-line part of the same arrangement.

To be able to conduct signals further in strip-line technology, the transmission arrangement 800 comprises a strip-line part which, in addition to the components which have been described in connection with the arrangement 700 also comprises a continuation in strip-line technology. This continuation comprises a third 830 section of the conductor which section cooperates with a fourth 860 and a fifth 880 ground plane section located on both sides of the conductor section 830 at a fourth distance d and, respectively, fifth distance (d3) therefrom.

The third conductor section 830 and the fourth 860 and fifth 880 ground plane sections have their main extensions in the same two planes (x,y) as the other conductor sections 810, 820 and ground plane sections 840, 850, 870 which are included in the strip-line arrangement, and the third conductor section (830) is displaced in parallel with respect to the other conductor sections (810, 820) along a third plane (z).

The third conductor section 830 exhibits an electrical connection 815 to the closest (820) of the other conductor sections, and the fourth and fifth ground plane sections are displaced with respect to the other ground plane sections along the same plane as the displacements of the conductor sections.

The conductor sections 810, 820, 830 are furthermore suitably displaced with respect to one another in a direction (y) which coincides with one of the two planes (x,y) which define the main extensions of the conductor sections, which provides the conductor in the arrangement 800 with the stepped construction which has been described above in association with other embodiments of the invention. It is also advantageous if at least one of the ground plane sections 840, 850, 860; 870, 880 is electrically connected to one of the closest ground plane sections on the same side of a conductor section. Ground plane sections 840 and 850 are connected by connector 845, and ground plane sections 850 and 860 are connected by connector 855.

The arrangement 800, like the arrangement 700, suitably also comprises an electrical connection 890 between the two ground plane sections 870, 850 which cooperate with the conductor section 820 in the strip-line part which is connected to the microstrip part of the transmission arrangement. This connection 890 is indicated by dashed lines in FIG. 8 and is preferably situated in connection with the edge of the ground plane section 870 which is close to the connection 805 between the conductor sections. The connection 890 is not in contact with any part of the conductor sections or the connection between them.

It can be said quite generally about the transmission arrangements 700 and 800 according to the invention, that the principles for extension and placing of conductor sections, ground plane sections and connections between conductor sections and, respectively, between ground plane sections which have been described in association with the other embodiments should also be taken into account in the construction of the embodiments 700 and 800. These principles will, therefore, not be discussed here.

The invention is not limited to the above-mentioned embodiments, but can freely varied within the scope of the patent claims following.

What is claimed is:

1. An electrical transmission line arrangement comprising:
  a first section of a conductor with a main extension in a first and a second plane;
  a first section of a ground plane, which extends essentially in parallel with the first conductor section on a first side thereof, at a certain first distance therefrom, and has a main extension in the first and second planes, the first conductor section and first ground plane section being included in a microstrip arrangement;
  a second section of the conductor; and
  a second ground plane section and a third ground plane section, where the second and third ground plane sections essentially extend in parallel with the second conductor section on first and second sides thereof at second and third distances therefrom, respectively, where the second conductor section and the second and third ground plane sections are included in a strip-line arrangement, the first and second conductor sections being separated from adjacent ones of the first, second, and third ground plane sections by a dielectric medium,
  wherein the first and second conductor sections are displaced in parallel with respect to one another along a third plane and have an electrical connection to one another, and
  wherein the first, second, and third ground plane sections are displaced in parallel with respect to one another along the third plane.

2. An electrical transmission line arrangement according to claim 1, also comprising a third conductor section which cooperates with a fourth and a fifth ground plane section situated on both sides of the third conductor section, at fourth and fifth distances therefrom, respectively, for forming a continuation of the strip-line arrangement,
  wherein the third conductor section and the fourth and fifth ground plane sections have their main extensions in the first and second planes,
  the third conductor section is displaced in parallel with respect to the first and second conductor sections along the third plane,
  the third conductor section has an electrical connection to the closest of the first and second conductor sections, and
  the fourth and fifth ground plane sections are displaced with respect to the first, second, and third ground plane sections along the third plane.

3. An electrical transmission line arrangement according to claim 1, in which the first and second conductor sections are also displaced with respect to one another in a direction which coincides with one of the first and second planes.

4. An electrical transmission line arrangement according to claim 1, in which at least one of the first, second, and third ground plane sections is electrically connected to a closest one of the ground plane sections on the same side as one of the first and second conductor sections.

5. An electrical transmission line arrangement according to claim 1, in which the first, second, and third ground plane sections are progressively displaced with respect to one another in a direction which coincides with one of the first and second planes.

6. An electrical transmission line arrangement according to claim 5, in which the first and second conductor sections exhibit different lengths in the direction in which the first and second conductor sections are progressively displaced with respect to one another.

7. An electrical transmission line arrangement according to claim 1, in which the connection between the first and second conductor sections is situated adjacent to edges of the first and second conductor sections which are closest to one another.

8. An electrical transmission line arrangement according to claim 1, in which two adjacent ones of the first, second, and third ground plane sections on the same side of one of the first and second conductor sections exhibit different lengths in the direction in which the first and second conductor sections are progressively displaced with respect to one another.

9. An electrical transmission line arrangement according to claim 1, in which the first, second, and third ground plane sections and first and second conductor sections are designed in such a manner that all points on the first and second conductor sections exhibit essentially the same capacitance with respect to the ground plane.

10. An electrical transmission line arrangement according to claim 1, in which the connection between the first and second conductor sections passes at least one edge in one of the first, second, and third ground plane sections, said at least one edge is designed for impedance matching.

11. An electrical transmission line arrangement according to claim 10, in which said design provides at least a part of the at least one edge with an elliptical shape.

12. An electrical transmission line arrangement according to claim 1, in which the distance between one of the first and second conductor sections and a closest one of the first, second, and third ground plane sections is essentially the same for the first and second conductor sections, with the closest ground plane section being closest in the direction which is at right angles to the first and second planes.

13. An electrical transmission line arrangement according to claim 1, in which the distance between two adjacent ones of the first, second, and third ground plane sections is essentially the same for all adjacent ones of the first, second, and third ground plane sections.

* * * * *

UNITED STATES PATENT AND TRADEMARK OFFICE
CERTIFICATE OF CORRECTION

PATENT NO. : 6,433,650 B1  Page 1 of 1
DATED : August 13, 2002
INVENTOR(S) : Harju et al.

It is certified that error appears in the above-identified patent and that said Letters Patent is hereby corrected as shown below:

<u>Title page,</u>
Item [73], please add the assignee information as follows:
-- Telefonaktiebolaget LM Ericsson (publ), Stockholm (SE) --

Signed and Sealed this

Twenty-ninth Day of July, 2003

JAMES E. ROGAN
*Director of the United States Patent and Trademark Office*